United States Patent [19]
Ishida et al.

[11] Patent Number: 5,998,272
[45] Date of Patent: *Dec. 7, 1999

[54] SILICIDATION AND DEEP SOURCE-DRAIN FORMATION PRIOR TO SOURCE-DRAIN EXTENSION FORMATION

[75] Inventors: Emi Ishida, Sunnyvale; Scott Luning, San Francisco; Dong-Hyuk Ju, Cupertino, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/745,475

[22] Filed: Nov. 12, 1996

[51] Int. Cl.$^6$ .................................................. H01L 21/336
[52] U.S. Cl. .......................................... 438/305; 438/535
[58] Field of Search ........................... 438/299, 301–303, 438/306–308, 535

[56] References Cited

U.S. PATENT DOCUMENTS

| | | | |
|---|---|---|---|
| 4,366,613 | 1/1983 | Ogura et al. | 29/571 |
| 5,270,256 | 12/1993 | Bost et al. | 437/195 |
| 5,316,969 | 5/1994 | Ishida et al. | . |
| 5,382,534 | 1/1995 | Sheu et al. | 437/35 |
| 5,491,099 | 2/1996 | Hsu | 437/35 |
| 5,780,350 | 7/1998 | Kapoor | 438/305 |

OTHER PUBLICATIONS

A Shallow Junction Submicrometer PMOS Process Without High–Temperature Anneals; P.G. Carey, K.H. Weiner and Thomas W. Sigmon; IEEE Electron Device Letters, vol. 9, No. 10, Oct. 1988.

Raised Source/Drain MOSFET with Dual Sidewall Spacers, M. Rodder and D. Yeakley, IEEE vol. 12, No. 3 (Mar. 1991).

Fabrication of sub–40–nm p–n junctions for 0.18 $\mu$m MOS device applications, Weiner & McCarthy, SPIE V.2091 (Sep. 1993).

New Methods of Shallow Junction Formation in Silicon Using Gas Immersion Laser Doping, Ishida, SSEL (Sep. 1994).

*Primary Examiner*—Richard Booth
*Attorney, Agent, or Firm*—Fliesler, Dubb, Meyer & Lovejoy LLP

[57] ABSTRACT

A process in accordance with the invention minimizes the number of heat steps to which an source-drain extension region is exposed, thus minimizing source-drain extension region diffusion and allowing more precise control of source-drain extension region thickness over conventional processes. In accordance with the invention, spacers are formed abutting the gate and then heavily doped source and drain regions are formed. The gate and source and drain regions are silicided. The spacers are subsequently removed and source-drain extension regions are then formed. In one embodiment of the invention, a laser doping process is used to form the source-drain extension regions.

16 Claims, 4 Drawing Sheets

SILICIDATION AND DEEP SOURCE-DRAIN FORMATION PRIOR TO SOURCE-DRAIN EXTENSION FORMATION

BACKGROUND OF THE INVENTION

1. Field of Invention

This invention relates to semiconductor device formation and particularly to the formation of source-drain extension regions.

2. Related Art

One trend of the semiconductor industry is to make semiconductor devices as small as possible. Often, however, process technology or the methods used in forming many devices impose limitations on how small a device can be made.

A typical semiconductor device and a primary building block in the semiconductor industry is the metal oxide semiconductor field effect transistor (MOSFET). A cross-section of a MOSFET is shown in FIG. 1. A MOSFET is typically composed of a gate 120 and an insulating gate oxide layer 115 both formed over a silicon substrate 110. Gate 120 is usually composed of polysilicon. Within substrate 110 are formed deep source-drain regions 150 (sometimes referred to as heavily doped source and drain regions) and source-drain extension regions 130 (sometimes referred to as lightly doped source and drain regions). Generally, doped regions are regions containing a higher concentration of p-type or n-type dopants than the substrate. Source-drain extension regions 130 generally have a lower concentration of dopants compared to deep source-drain regions 150, although some technologies allow the regions to be doped at equivalent levels. Further source-drain extension regions 130 have a thickness $t_1$ which is smaller than thickness $t_2$ of deep source-drain regions 150. Shallow source-drain extension regions 130 are important for reducing hot carrier injection (HCI), which often occurs in scaled down (e.g., sub-micron) devices, and for maintaining other device characteristics such as threshold voltage rolloff, punchthrough, and other short channel characteristics. Thicker deep source-drain regions are generally important for lowering device resistivity, for maximizing drive current.

In reducing the size of MOSFET devices much of the focus has been on reducing the length L of the gate 120. As the gate length L is reduced, however, the device size must also be reduced in the vertical direction—that is, the source-drain extension region thickness $t_1$ must be reduced. Formation of shallow source-drain extension regions, however, requires precise control of dopant distribution on a fine scale. Unfortunately, while technology will allow other portions of MOSFET devices to be scaled smaller, e.g., gates scaled to sub-micron lengths, limitations in forming finely scaled source-drain extension regions have prevented semiconductor devices from reaching their smallest dimensions.

Typically conventional processes of forming a MOSFET device will have the following steps. Gate oxide 115 and gate 120 are formed on substrate 110. Source-drain extension regions 130 are next formed, often by ion implantation. Once source-drain extension regions 130 are formed, oxide spacers are formed abutting the gate 120 to protect the source-drain extension regions from further doping. Deep source-drain regions are then formed, often by ion implantation. These regions (both source-drain extension and deep source-drain) are then annealed by heating to form the proper lattice structures and to electrically activate the dopants in these regions. Before removing the spacers, and usually after annealing, a silicide or other conductive layer is formed on the deep source-drain regions 150 and gate 120 to increase conductivity. Silicidation generally requires two additional heating steps.

There are generally two ways to make a doped region shallower. One way is to implant ions at a lower energy (e.g., 1 keV instead of 20 keV). The second way to reduce the amount of dopant diffusion is to reduce anneal time and/or temperature. Annealing and other heat steps cause the doped regions to diffuse, thus causing the doped regions to expand and deepen in thickness. The longer the time and the higher the temperature of a heat step, the deeper the doped regions become.

In common processes, both deep source-drain and source-drain extension regions are annealed simultaneously, or source-drain extension regions are annealed and then re-exposed to anneal temperatures during the deep source-drain region anneal. These anneal steps cause both types of regions to deepen as a result of diffusion. By annealing for a shorter time or at a lower temperature, the source-drain extension region thickness can be minimized, especially if a low energy implant of the source-drain extension region is also used. Nonetheless, a reduced anneal would also cause the deep source-drain regions to be formed too shallow. Too shallow a deep source-drain region is undesirable because it alters device characteristics (e.g., device resistivity and drive current) and makes formation of reliable contacts difficult. Silicidation of deep source-drain regions eats into the deep source-drain depth, causing an already shallow deep source-drain region to be even further reduced.

Thus, even using a low energy source-drain extension implant with conventional device formation processes, the manufacturer has very limited control over maintaining shallow source-drain extension thickness because of diffusion resulting from subsequent anneal and other heat steps and because deep source-drain depth must be maintained.

Other methods of forming source-drain extension regions have been put forth as allowing more control in the formation of such extension regions. One such method is laser doping. These methods, however, have not been generally used because of serious process problems, including melting the polysilicon gate in the case of laser doping.

Therefore, it is desirable to develop a process which allows for more controlled shallow source-drain extension formation without affecting deep source-drain region depth or negatively influencing other device characteristics.

SUMMARY OF THE INVENTION

The present invention is generally directed toward a controlled process which allows the formation of shallow source-drain extension regions. A process in accordance with the invention is designed to minimize the number of heat steps to which a source-drain extension region is exposed, thus minimizing source-drain extension region diffusion and allowing much more precise control of source-drain extension region thickness than with conventional processes.

A method in accordance with the invention is generally as follows. Spacers are formed abutting a gate, which has been previously formed on a substrate. Once spacers are in place, heavily doped source and drain regions are formed in the substrate. A silicide or other conductive layer is then formed on the deep source and drain regions and on the gate. The spacers are subsequently removed and source-drain extension regions are formed in the substrate. In this manner, source-drain extension regions need not be exposed to the heat steps of the deep source and drain region anneal or to the heat steps of silicide formation. In one embodiment of the invention, the source-drain extension regions and/or deep source-drain regions are formed with a laser doping process.

A method in accordance with the invention has several advantages. Not only does such method allow controlled source-drain extension formation thereby allowing smaller overall device formation, but such method is also advantageous because it requires minimal process steps compared to other methods (e.g., "reverse LDD"). Further, oxide etching steps for spacer removal are performed in a manner and at a time which minimizes silicide "gap penetration" into the doped regions and/or substrate, resulting from an etched down field oxide region. Finally, a process in accordance with the invention enables laser doping processes, which allows for the formation of source-drain extension regions which are approximately 100 Å in thickness.

BRIEF DESCRIPTION OF THE DRAWINGS

The present invention is described with respect to particular exemplary embodiments thereof, and reference is accordingly made to the drawings wherein like numbers denote like parts, in which.

DETAILED DESCRIPTION

Precise control of source-drain extension regions will aid in enabling the formation of smaller semiconductor devices. Problems often arise in source-drain extension formation in conventional processes because heat steps following source-drain extension formation cause source-drain extension region diffusion. Thus, a process which minimizes source-drain extension region heat step exposure is disclosed.

Figure 1:
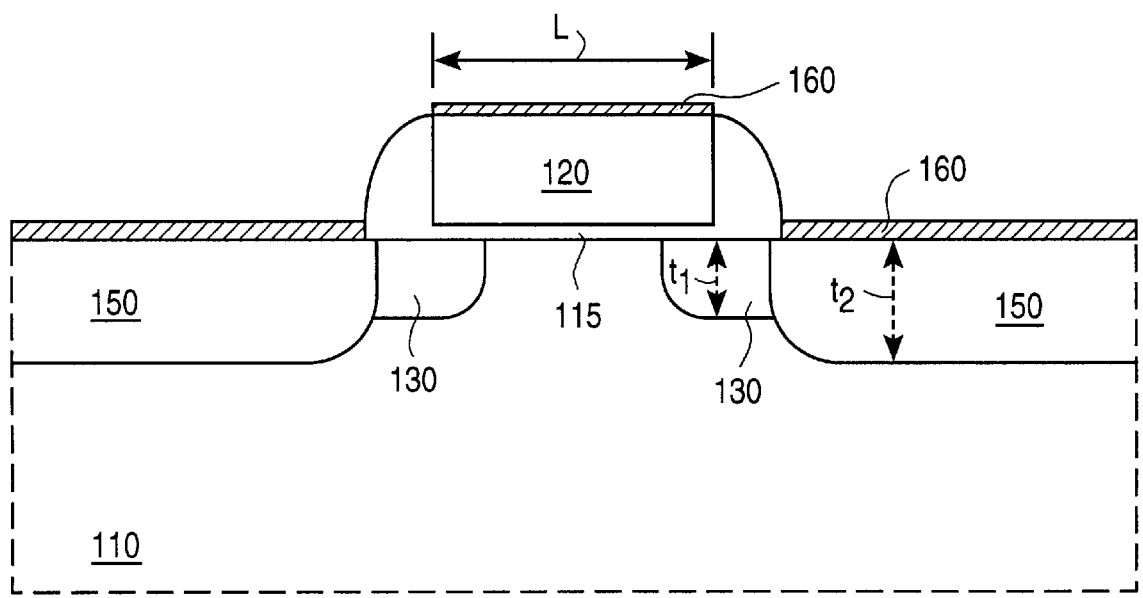
FIG. 1 is a cross-sectional view of a semiconductor device.
Figure 2A:
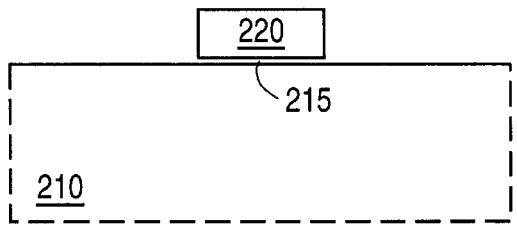
FIGS. 2A–2F are cross-sectional views of a semiconductor device in various stages of formation using a conventional formation process.

A conventional process for forming a semiconductor device (e.g., a MOSFET) is described with reference to FIGS. 2A–2F. Such a process begins with a substrate 210 upon which is deposited or grown an oxide or other insulating layer. Over the oxide layer is formed a polysilicon layer or layer of other conducting material. The polysilicon layer and the oxide layer are patterned and etched to form gate oxide 215 and polysilicon gate 220, as shown in FIG. 2A.

Figure 2B:
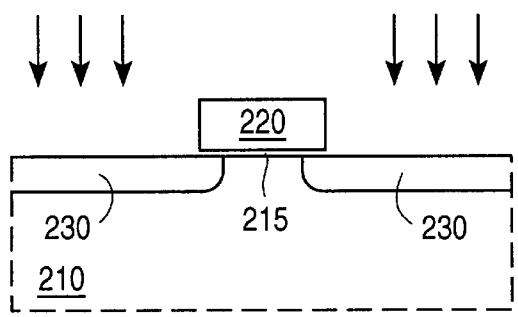
Figure 2C:
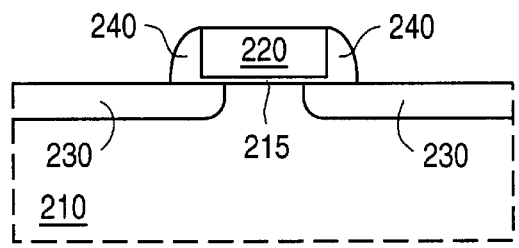

Source-drain extension regions 230, also known as tabs or lightly doped source and drain regions (LDD), are then generally formed by ion implanting the substrate, often with boron, arsenic, or phosphorous ions and at an energy level in the range of 1–100 keV. Source-drain extension regions 230 are shown in FIG. 2B. Some processes perform an anneal step at this stage to electrically activate doped extension regions 230.

After the source-drain extension regions 230 are implanted, spacers 240 are then formed abutting the gate 220. Spacers 240 serve to protect the underlying source-drain extension region from additional implantation. Spacers 240 further serve to isolate the gate and the source-drain regions from electrically connecting during a subsequent silicide step (discussed below). To form spacers, typically an oxide layer is deposited, by chemical vapor deposition (CVD) or other well-known methods, over the entire wafer construct, including substrate and gate. The oxide layer is then anisotropically etched, resulting in spacers 240, FIG. 2C.

Figure 2D:
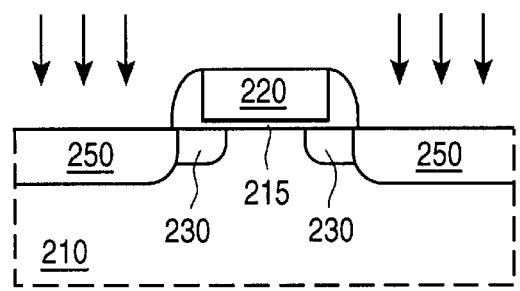

Once spacers 240 are in place, heavily doped source and drain regions (deep source-drain regions) 250 are formed, usually by ion implantation at an energy in the range of 20–120 keV, FIG. 2D.

Figure 2E:
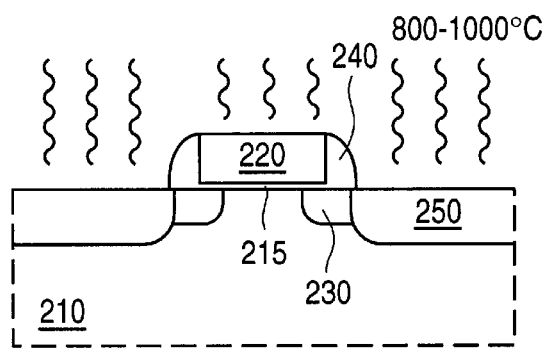

FIG. 2E shows an anneal, or heat, step, where squiggly lines represent heat. Annealing reforms the substrate lattice structure and electrically activates the doped regions 230 and 250. Annealing typically is done at 800–1000° C.

Figure 2F:
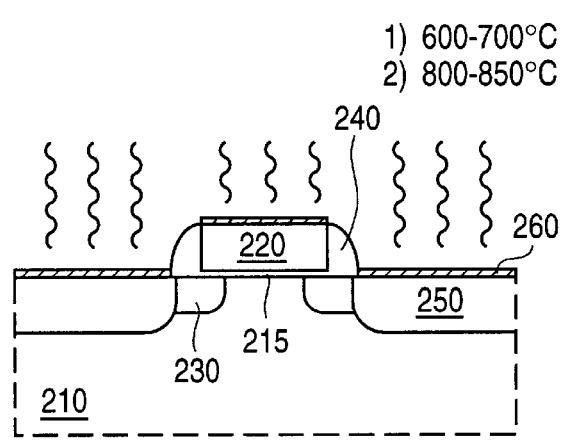

A silicide layer 260 is formed on the gate 220 and deep source-drain regions 250, FIG. 2F. Silicide layer 260 is most often formed of $TiSi_2$, although it can be formed from another high conductivity material, and is important in lowering the resistivity of the device. It is equally important, however, to have the silicide only in desired locations. Titanium silicide is usually chosen because it does not react with oxide at certain temperatures, and its selective placement on the gate 220 and deep source-drain regions 250 can thus be controlled. In forming titanium silicide, first titanium (Ti) is deposited over the entire construct. The construct is heated to approximately 600–700° C. Wherever the Ti is touching the silicon (Si), the Ti reacts with the Si to form $TiSi_2$. The Ti will not generally react with oxide at 600–700° C., although it may react with oxide at higher temperatures. Once $TiSi_2$ is formed, the unreacted Ti is removed by methods known in the art. The structure is then again heated to approximately 800–850° C. to reduce the resistivity (and thus increase conductivity) of the $TiSi_2$. The spacers serve to prevent silicide from forming over the source-drain extension regions as well as preventing the silicide from forming a connection between the gate 220 and the deep source-drain regions 250. Once silicidation has occurred, the spacers may be removed, although some processes allow them to be left in place.

Thus as discussed with respect to FIGS. 2A–2F, source-drain extension regions are exposed to at least three heat steps: the doped-region-activation anneal (FIG. 2E), and the two silicidation heat steps (FIG. 2F). Each of these heat steps causes the source-drain extension regions 230 to increase in depth.

To the contrary, a short anneal step, or an anneal step at a lower temperature, in FIG. 2E, may cause deep source-drain regions 250 to fail to reach their required depth. Moreover, in forming silicide layers 260, when the titanium reacts with the silicon, it takes away the uppermost portion of deep source-drain region 250. Thus, a too shallow deep source-drain region will be further reduced in size during the silicidation steps shown in FIG. 2F. Shallow deep source-drain regions may cause the device to fail to meet desired conductivity requirements and may result in excessive junction leakage.

One solution suggested to minimize source-drain extension region thickening, is a "reverse LDD" process. In such a process, the deep source-drain regions are formed first, followed with an anneal step, and are made close to their required depth. Subsequently the source-drain extension regions are formed followed by an additional anneal step. In this manner, an anneal for the source-drain extension regions can be specialized and controlled separately from the anneal steps for the deep source-drain regions.

Figure 3A:
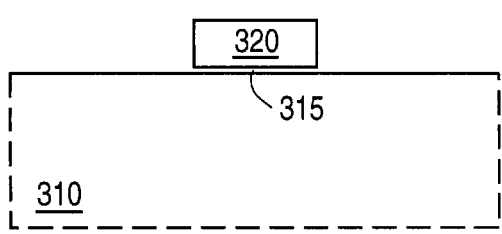
FIGS. 3A–3I are cross-sectional views of a semiconductor device in various stages of formation using a "reverse LDD" process.
Figure 3F:
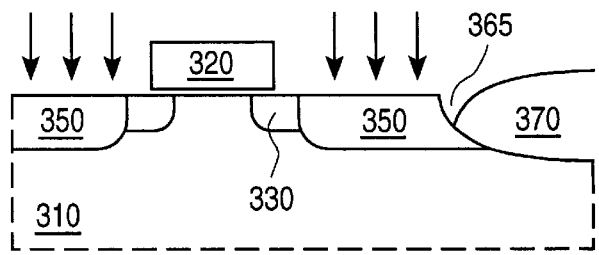
Figure 3B:
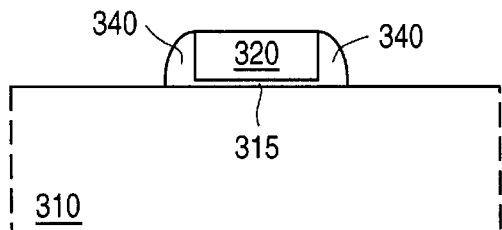

A reverse LDD process is described with respect to FIGS. 3A–3J. FIG. 3A shows a substrate 310 upon which is formed a gate oxide 315 and a polysilicon gate 320, both formed in the same manner as is done in conventional processes. In FIG. 3B spacers 340 are formed abutting gate 320. Spacers 340 are formed as is conventionally done, e.g., by oxide deposition and a subsequent anisotropic etch.

Figure 3G:
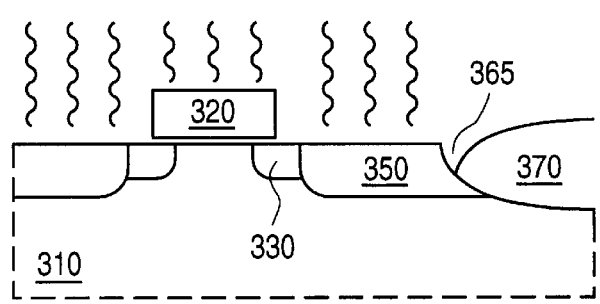
Figure 3C:
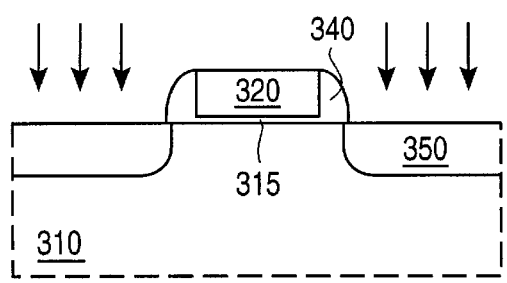
Figure 3H:
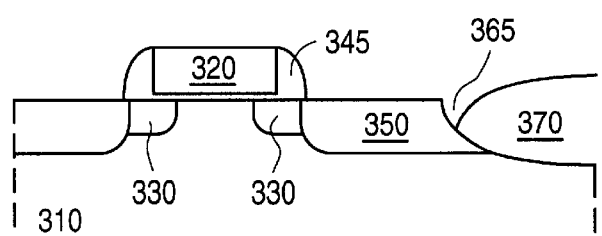
Figure 3D:
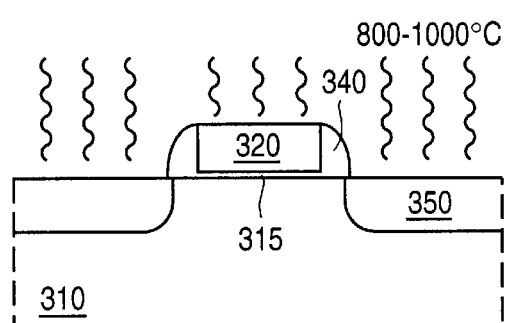
Figure 3I:
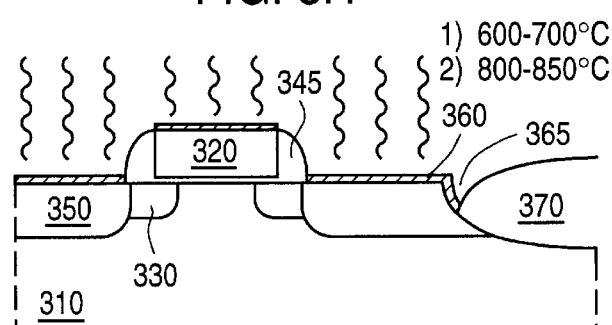

Once spacers 340 are formed, deep source-drain regions 350 are ion implanted or otherwise formed, as shown in FIG. 3C, and then annealed, FIG. 3D. After deep source-drain formation, spacers 340 are removed by a selective oxide etch or by other well known processes, FIG. 3E.

In FIG. 3F, source-drain extension regions 330 are ion implanted or otherwise formed. A second annealing step, represented in FIG. 3G, is then performed. This annealing step can be designed specifically for activating source-drain extension regions 330, since deep source-drain regions were activated previously (in FIG. 3D).

Before silicidation can take place, spacers must again be formed to protect source-drain extension regions 330 and isolate gate 320 from deep source-drain regions 350. Thus, in FIG. 3H, spacers 345 are formed, again, for instance, by oxide layer deposition, followed by an anisotropic etch. Once spacers 345 are formed, TiSi$_2$ layers 360 are formed as is done conventionally. That is, titanium is deposited over the entire structure, the structure is heated to 600–700° C. causing Ti to react with Si, unreacted Ti is removed, and the structure is again heated to approximately 800–850° C. In some processes, the spacers may be removed with a selective oxide etch.

Although reverse LDD allows for more controlled source-drain extension formation by allowing the source-drain extension region to be annealed independently of the deep source-drain region, this process still allows the source-drain extension region to be exposed to the two silicidation heat steps. Each of these heat steps in turn causes the source-drain extension region to increase in thickness.

Figure 3E:
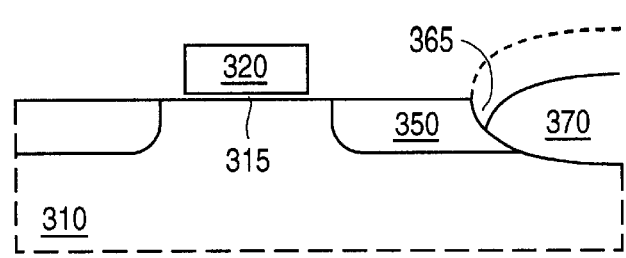

Moreover, spacer removal by a selective oxide etch in FIG. 3E not only causes the spacers to be removed, but will also etch down field oxide region 370, forming gap 365. (Field oxide region 370 acts as an isolation region between semiconductor devices that are formed on a single wafer.) When silicide is later formed on the structure, in FIG. 3I, the prior etching of the field oxide allows the silicide to extend down into the gap 365 (herein referred to as "gap penetration"), which can cause problems such as a leaky diode, or in extreme circumstances, a short to the substrate.

In addition, having to add a second set of spacers 345 (in FIG. 3H) before silicidation increases the number of steps required to form such semiconductor devices. These extra steps increase the difficulty of manufacturing these types of devices as well as increasing their costs.

Figure 4A:
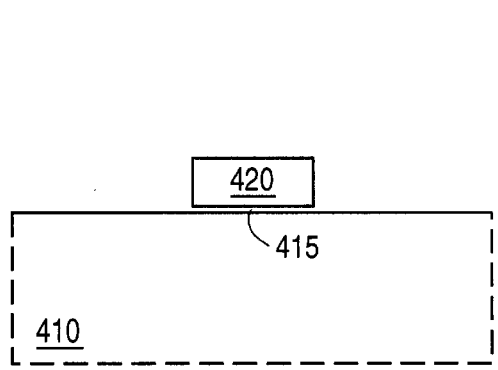
FIGS. 4A–4H are cross-sectional views of a semiconductor device in various stages of formation using a process in accordance with the invention.

Thus, with reference to FIGS. 4A–4H one embodiment of a method in accordance with the invention is described. FIG. 4A shows a substrate 410 on which is formed a gate oxide 415 of approximately 100 Å or less in thickness and a polysilicon gate 420 having a length of 2000 Å±500 Å, both formed using conventionally known methods. Other embodiments of the invention may form gate oxides and/or gates of differing dimensions.

Figure 4B:
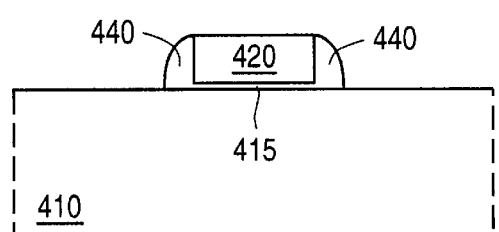
Figure 4C:
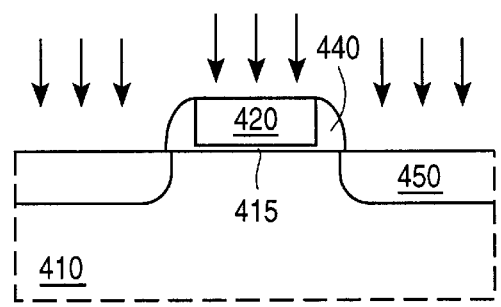
Figure 4D:
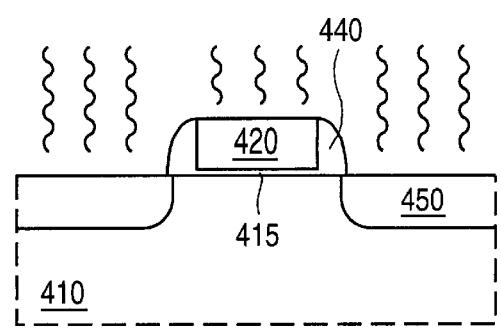

In FIG. 4B, spacers 440 are formed abutting gate 420 according to conventional methods—that is, an oxide layer is deposited over the entire structure, including the gate and the substrate and then an anisotropic etch is performed. Materials other than an oxide as well as other methods of spacer formation may also be suitable for forming spacers 440 in other embodiments of the invention.

After spacer formation 440, deep source-drain regions 450 are then formed. The substrate is ion implanted or dopants are introduced by other well known methods, FIG. 4C. The deep source-drain regions 450 are then annealed, in FIG. 4D, by heating the construction to approximately 800–1000° C. In one embodiment of the invention, the deep source-drain regions are formed to be approximately 2000 Å in thickness.

Figure 4E:
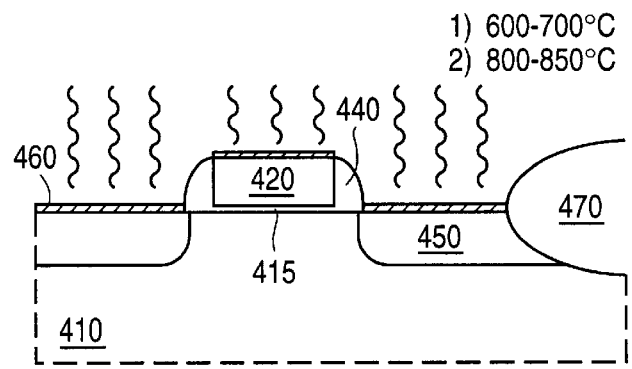

After forming deep source-drain region 450 and before removing spacers 440, selective silicidation is performed. Titanium is deposited over the entire structure, and the structure is heated to approximately 600–700° C., causing the titanium to react with the silicon of the deep source-drain regions and the gate 420 to form TiSi$_2$. Unreacted titanium is removed and the structure is heated again to approximately 800–850° C. to increase the TiSi$_2$ conductivity. The result is shown in FIG. 4E. The resulting TiSi$_2$ is approximately 200–1000 Å in thickness, and in one embodiment, the TiSi$_2$ is approximately 800 Å in thickness. Materials other than Ti can be used to form silicides in other embodiments of the invention. If other materials are used, temperatures for silicide formation should be varied accordingly. Moreover, other embodiments of the invention can use a non-silicide material to form a conducting layer on the deep source-drain and gate regions.

Figure 4F:
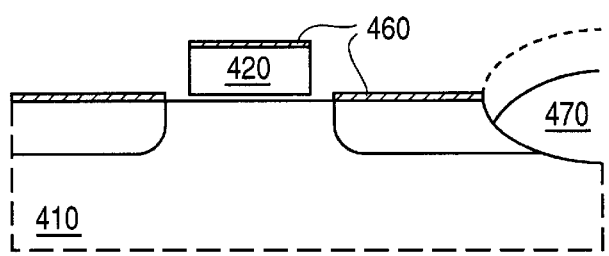

After silicidation the spacers are removed by a selective oxide etch or other known methods of spacer removal, FIG. 4F.

Figure 4G:
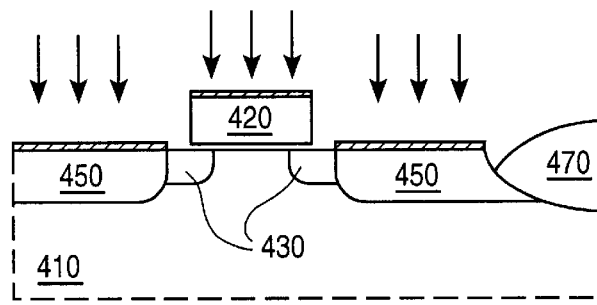
Figure 4H:
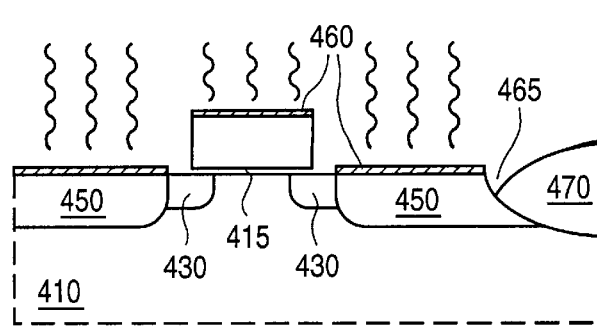

Following spacer removal, source-drain extension regions 430 are formed laterally adjacent to deep source-drain regions 450 by ion implantation or other known methods of introducing dopants into a substrate, FIG. 4G. Dopants are introduced by ion implantation in one embodiment of the invention, at an angle between 0° and 20° from perpendicular to the substrate surface. Once dopants are introduced, source-drain extension regions then can be annealed, in FIG. 4H.

Thus, using a method in accordance with the invention, the only heat cycle to which the source-drain extension regions 430 are exposed is one specifically geared toward source-drain extension annealing. In this manner, source-drain extension depth can be minimized and optimized. In one embodiment of the invention, which uses ion implantation to introduce dopants into the substrate to form source-drain extension regions, the resulting source-drain extension regions 430 are approximately 300–1500 Å in thickness.

In certain embodiments of the invention, the anneal step for activating and maintaining shallow source-drain extension regions 430 is specially designed for source-drain extension regions 430 and is performed at a temperature lower than the temperature used for activating deep source-drain regions. In one of these embodiments, the source-drain extension anneal step is combined with at least one of the TiSi$_2$ heat steps, thereby reducing the steps required for device formation.

Use of a method in accordance with the invention is beneficial not only because of a controlled source-drain extension anneal step, but because spacers 440 are not removed until after silicidation occurs (FIGS. 4E and 4F). Even if some of the field oxide region 470 is lost during spacer removal (as shown in FIG. 4F), it will be of little concern because the silicide will have been pre-formed and thus will not penetrate into the gap 465 formed by oxide removal.

A process as shown in FIGS. 4A–4H is particularly useful when used in conjunction with laser doping processes. In laboratory tests, laser doping processes have been shown to be capable of producing doped regions in silicon at the sub-40-nm level, and as small as 100 Å.

Generally, with laser doping, the silicon surface is exposed to intense irradiation by an excimer laser for a period lasting only several nanoseconds (approximately 50 ns or less). During this period, the silicon surface transitions from solid to liquid, at which time dopants diffuse into the liquid silicon.

Specifically, laser doping uses an excimer laser, often as XeCl laser, as an energy source. The output of the laser is directed through optics to homogenize the beam and then passed through an illuminator to scan the beam over a dielectric reticle. The reticle is then imaged, via projection optics, onto the wafer. In the illuminated areas, the incident photon energy is absorbed in approximately the top 7 nm of the silicon and converted to thermal energy, heating the surface and activating the diffusion of the impurities into the substrate. More information with respect to laser doping is contained in Weiner & McCarthy, "Fabrication of sub-40-nm p-n junctions for 0.18 $\mu$m MOS device applications using a cluster-tool-compatible, nanosecond thermal doping technique," Microelectronic Processes, Sensors, & Controls, Vol. 2091 (Int'l Soc. for Optical Eng., Sept. 1993).

Laser doping is advantageous for several reasons, including the following. First, dopants generally will penetrate throughout the liquid silicon, but will only minimally diffuse into the solid regions. Thus, junction depth is controlled by the melt depth of the silicon. Second, high-temperature anneal steps are not required because impurities are incorporated into electrically active sites. Third, control of the process is generally simple. Fourth, the process results in low sheet and contact resistances. And finally, the process eliminates considerable photoresist processing.

Despite its many advantages, laser doping has not become widespread. The process as described above has been attempted to be used with processes such as those described with reference to FIGS. 2A–2F and 3A–3I, but has proven problematic. In using a laser doping process, in particular to form shallow source-drain extension regions and/or deep source-drain regions, when the silicon is melted by exposure to the laser energy, the polysilicon gate tends to melt as well, creating useless devices.

Referring to FIGS. 4A–4H, a process in accordance with the invention overcomes polysilicon gate melting in laser doping processes. Accordingly, the steps depicted in FIGS. 4A–4D are carried out as described previously. In FIG. 4E, when a conductive material such as silicide (e.g., TiSi$_2$) is applied to the gate 420 as described previously or formed using a laser from a refractory metal such as titanium or cobalt, the material modifies the optical properties (e.g., the reflectivity) of the gate. In FIG. 4G, if laser doping is used to form source-drain extension regions 430 and/or deep source-drain regions, rather than an ion implant, the silicide prevents the gate from melting. For more detailed information with respect to laser silicide formation, see Stanford University Ph.D. Thesis by Emi Ishida entitled "New Methods of Shallow Junction Formation in Silicon Using Gas Immersion Laser Doping" (Nov. 1994).

In another embodiment the refractory metal or silicon substrate is subjected to an implant (for example, silicon or germanium) to pre-amorphize the silicon prior to laser silicide formation.

Thus, a process has been described in which the source-drain extension region is exposed to only one heat cycle, specialized for annealing the source-drain extension regions. Further, such a process has been described which minimizes the number of steps taken to form a semiconductor device over other types of processes (e.g., "reverse LDD" processes) and also prevents silicide "gap penetration." Moreover, a process in accordance with the invention also enables laser doping processes, which do not require anneal steps, which significantly reduce photoresist process steps, and which can form source-drain extension regions as small as 100 Å.

It should be understood that the particular embodiments described above are only illustrative of the principles of the present invention, and various modifications could be made by those skilled in the art without departing from the scope and spirit of the invention. For instance, doping of the deep source-drain regions could occur simultaneously with, before, or after silicide formation. Thus, the scope of the present invention is limited only by the claims that follow.

What is claimed is:

1. A method of forming a semiconductor device with a substrate having a gate insulating layer and a gate formed thereon, comprising the sequential steps of:

forming a spacer abutting said gate;

forming a heavily doped region in said substrate;

forming a conductive material layer on each of said heavily doped region and said gate;

removing said spacer; and forming a lightly doped region having a top surface substantially co-planar with the top surface of said heavily doped region in said substrate.

2. The method of claim 1, wherein said step of forming a conductive material layer on said gate alters the optical properties of said gate, and wherein said step of forming a lightly doped region includes forming said lightly doped region with a laser doping process.

3. The method of claim 1, wherein said step of forming a lightly doped region includes implanting said substrate at an angle substantially perpendicular to the substrate surface.

4. The method of claim 3, further including the steps of:

annealing said heavily doped region, preceding the step of forming a lightly doped region; and annealing said lightly doped region.

5. The method of claim 1, wherein the step of forming a conductive material layer includes forming a silicide layer on each of said heavily doped region and said gate.

6. The method of claim 1, wherein said step of forming a lightly doped region includes forming a lightly doped region of less than 1500 Å in thickness.

7. A method of forming a semiconductor device with a substrate having a gate insulating layer and a gate formed thereon, comprising the steps of:

forming a spacer abutting said gate;

forming a deeply doped region in said substrate;

forming a silicide layer on said heavily doped region and said gate, wherein said silicide layer alters the optical properties of said gate; and then removing said spacer; and forming, with a laser, a lightly doped region in said substrate having a top surface substantially co-planar with the top surface of said heavily doped region, wherein said laser causes a portion of said substrate to melt and wherein said silicide on said gate minimizes gate melting.

8. The method of claim 7, wherein said step of forming, with a laser, a lightly doped region includes forming a lightly doped region of less than 1500 Å in thickness.

9. The method of claim 8, wherein said step of forming, with a laser, a lightly doped region includes forming a lightly doped region of approximately 100 Å.

10. The method of claim 7, wherein said step of forming, with a laser, a lightly doped region includes the steps of:

directing the photon energy of an excimer laser beam onto the substrate surface.

11. The method of claim 7, wherein said step of forming a silicide layer includes the steps of:

forming a titanium layer over said heavily doped region, said spacer, and said gate; and heating said titanium layer.

12. A method of forming a semiconductor device with a substrate having a gate insulating layer and a gate formed thereon, comprising the sequential steps of:

forming a spacer abutting said gate;

forming a silicide layer on said gate, wherein said silicide layer alters the optical properties of said gate;

forming, with a laser, a heavily doped region in said substrate, wherein said laser causes a portion of said substrate to melt and wherein said silicide on said gate minimizes gate melting and then removing said spacer; and forming with a laser doping process, a lightly doped region in said substrate having a top surface substantially co-planar with the top surface of said heavily doped region in said substrate.

13. A method of forming a semiconductor device with a substrate having a gate oxide and a polysilicon gate formed thereon, comprising the steps of:

forming spacers abutting said polysilicon gate;

forming heavily doped source and drain regions;

annealing said heavily doped source and drain regions;

forming a silicide layer on each of said heavily doped source and drain regions and said gate and then removing said spacers;

implanting lightly doped source and drain regions at an angle substantially perpendicular to said substrate surface and having a top surface substantially co-planar with the top surface of said heavily doped source and drain regions following said step of forming a silicide layer; and annealing said lightly doped source and drain regions.

14. The method of claim 13, wherein:

the step of annealing said heavily doped source and drain regions includes heating said heavily doped source and drain regions to approximately 800–1000° C.; and the step of annealing said lightly doped source and drain regions includes heating said lightly doped source and drain regions to a temperature lower than the temperature used in the step of annealing said heavily doped source and drain regions.

15. The method of claim 14, wherein said step of forming a lightly doped region includes forming a lightly doped region of less than 1500 Å in thickness.

16. The method of claim 15, wherein the step of forming a silicide layer includes the step of:

depositing a titanium layer over said heavily doped source and drain regions, said spacers, and said polysilicon gate;

heating said titanium layer to approximately 600–700° C., causing it to form a $TiSi_2$ layer on each of said heavily doped source and drain regions and said polysilicon gate;

removing any unreacted titanium; and heating said $TiSi_2$ layers to approximately 800–850° C.

* * * * *